United States Patent [19]

Battocletti

[11] 4,356,446
[45] Oct. 26, 1982

[54] TIME DIVISION MULTIPLIER TRANSDUCER WITH SELECTIVE PHASE SHIFT

[75] Inventor: Frank E. Battocletti, Columbus, Ohio
[73] Assignee: TransData, Inc., Dublin, Ohio
[21] Appl. No.: 246,848
[22] Filed: Mar. 23, 1981
[51] Int. Cl.³ .......................................... G01R 25/00
[52] U.S. Cl. .............................. 324/83 R; 324/140 R; 324/142
[58] Field of Search ................ 324/83 R, 83 A, 83 D, 324/83 FE, 142, 140 R; 307/358, 511, 514; 328/133

[56] References Cited

U.S. PATENT DOCUMENTS

| | | | |
|---|---|---|---|
| 3,500,200 | 3/1970 | Woodhead | 324/142 |
| 3,746,851 | 7/1973 | Gilbert . | |
| 3,794,917 | 2/1974 | Martin et al. | 324/142 |
| 3,975,682 | 8/1976 | Mayfield | 324/142 |
| 3,976,942 | 8/1976 | Mayfield | 324/142 |
| 4,055,804 | 10/1977 | Mayfield | 324/142 |
| 4,068,210 | 1/1978 | Corkhill | 324/83 D |
| 4,084,133 | 4/1978 | Zimmer | 324/83 A |
| 4,167,698 | 9/1979 | Podlewski | 324/83 A |

OTHER PUBLICATIONS

E. A. Goldberg, "A High Accuracy Time Division Multiplier," RCA Review, vol. XIII, pp. 265-274, Sep. 1952.
Sternberg, "An Accurate Electronic Multiplier," RCA Review, pp. 618-634, Dec. 1955.
R. Bergeest and P. Seyfried, "Evaluation of the Response of Time-Division Multipliers to A.C. and D.C. Input Signals," IEEE Transactions on Inst. in Measurement, vol. 1, M-24, No. 4, pp. 296-299, Dec. 1975.

Primary Examiner—Michael J. Tokar
Attorney, Agent, or Firm—Mueller and Smith

[57] ABSTRACT

A power transducer of a variety utilizing time division multiplication and configured under a principle of operation incorporating an integrator stage. Phase adjustment for the transducer is provided by a network which is coupled with the non-inverting input of the integration stage. In one embodiment, this network may be present as an R-C network.

17 Claims, 6 Drawing Figures

TIME DIVISION MULTIPLIER TRANSDUCER WITH SELECTIVE PHASE SHIFT

BACKGROUND OF THE INVENTION

The utilities and principal power consuming industries, for an extensive period of time, have made use of transducers serving to evaluate or meter a broad variety of the parameters of measurement of electrical energy. Such parameters will include, inter alia, a.c. current, a.c. voltage, frequency, watts, vars, Q, watt hours, var hours, Q hours, phase and power factor. When employed by industry, the transducers generally are provided having an input associated with power lines through isolation and scaling components, for example voltage and/or current transformers. Operating upon these inputs, the transducers then provide outputs, which, preferably, are present as linearly scaled currents which, for example, may be suitable as signals introduced to a data acquisition system such as a computer or some form of less elaborate recording instrumentation. Where the parameters are units of power, a multiplication must be carried out by the transducers, for example, watt monitoring signals represent the product of voltage and current.

Early technical approaches taken to develop power monitoring signals initially involved the use of thermally responsive coil elements and the like, the temperatures of which could be converted to outputs corresponding with power. A lack of convenience and accuracy with such techniques led to interest in the utilization of Hall effect devices as multipliers wherein a voltage-proportional generated magnetic field and current were associated to provide a voltage output proportional to the product of current and voltage. Transducers may also utilize an electronic arrangement serving to capitalize upon the exponential transfer characteristic of solid-state devices to carry out multiplication. However, for power monitoring applications these solid-state techniques exhibit an accuracy which is lower than desired.

Another technique for product derivation currently popular in the industry utilizes the system concept of time division multiplication. For example, the multiplier produces a pulse waveform whose amplitude is proportional to one variable, whose length relative to period is a function of another variable, and whose average value is proportional to the product of the two variables. Early investigations of the use of electronic time division multipliers are reported upon in the following publications which are incorporated herein by reference:

I. E. A. Goldberg, "A High Accuracy Time Division Multiplier," *RCA Review*, Volume XIII, pp. 265–274, September, 1952.
 II. Sternberg, "An Accurate Electronic Multiplier," *RCA Review*, pp. 618–634, December, 1955.
 III. R. Bergeest and P. Seyfried, "Evaluation of the Response of Time-Division Multipliers to A.C. and D.C. Input Signals," IEEE. Transactions on Instrumentation In Measurement, Vol. 1 M-24, No. 4, pp. 296–299, December, 1975.

Time division multiplier networks generally are configured having a pulse width modulation circuit which is fed one of two input parameters and a switching circuit, usually controlled by the output signal of the modulator. As described in publication III above, the modulation circuits may be configured to operate in accordance with any one of three principles. In a first of these principles, the modulation factor is proportional to an input quantity. Accordingly, the pulse or sampling frequency is variable in accordance with input amplitude and an integration procedure is resorted to. In a second principle, the modulation factor remains proportional to an input parameter, but the sampling frequency does not depend upon input amplitude and thus, is fixed. With such an arrangement, integration is not required. The third principle looks to the input parameter charging of capacitor associated with the utilization of a reference current discharge thereof and comparator detection. As in the second principle, no integration is carried out.

For any of the above principles elected by the designer of a transducer utilizing time division multiplication, the voltage input transformers inherently will evoke a phase shift of the incoming signal and the dictates of design accuracy rquire that such error be corrected. Further, where power factor related output signals are developed by the transducers, then a select phase shift, for example of 60° to 90° must be made available in the transducer design. Generally, the common technique for providing a phase shift correction, for example, into the integration stage of a transducer operating in accordance with the first principle, is to provide a separate compensation circuit which evokes a phase shift without a gain. While such phase shift correction can be achieved, the separate circuits involved have been observed to introduce their own errors into the entire transducer system design. Thus, difficulties conventionally encountered with amplifiers or the like, i.e. offset voltages, temperature occasioned excursions, and the like, are introduced with the result of loss of accuracy and reliability.

SUMMARY

The present invention is addressed to a power transducer utilizing a time division multiplication network of a variety incorporating an integration stage. Through the assertion of a select phase adjustment signal at the non-inverting input to this stage, not only may phase errors be corrected, but select phase shifts may be inserted. Such correction and alteration occurs due to a change in configuration of the integration stage itself, thus avoiding the errors otherwise encountered with the use of separate phase error correcting circuits. Of particular importance, a capability is provided for inserting desired larger phase shifts for carrying out var, Q or watt evaluations.

This phase correction and adjustment may be carried out through the utilization of R-C networks responsive to the voltage signals which are usually scaled, and which correspond with monitored line voltage.

A further object and feature of the invention is to provide a power transducer which includes an arrangement for receiving a signal, $v_1$, corresponding with monitored line voltage. The transducer further incorporates an arrangement for deriving signals at a level, $v_2$ of opposite polarity and corresponding with alternating line current. A time division multiplier is provided with the transducer which includes an integration stage having inverting and non-inverting inputs. The inverting input is arranged to receive the signal, $v_1$, and the multiplier further includes a threshold responsive device such as a Schmitt trigger which is responsive to the output of the integration stage for deriving time variable switching signals. A low pass filter is provided having a power monitoring output, $v_o$, and means are provided for deriving reference signals, $V_R$, of opposite polarity. A switching arrangement, which may be present as a voltage controlled switch is actuable in response to the time variable switching signals for effecting the alternate application of the reference signals of opposite polarity to the inverting input of the integrator stage and serves to simultaneously effect the alternate application of signals at level, $v_2$, of opposite polarity to the low pass filter. Phase adjustment according to the invention is provided to apply a select signal, $v_c$, at the non-inverting input of the integration stage to provide a predetermined phase angle characteristic for the low pass filter output. The phase adjustment signal, $v_c$, may be selected to provide a power monitoring output, $v_o$, corresponding with the expression:

$$v_o = \frac{v_2(v_1 - 2v_c)}{V_R}.$$

As another object and feature of the invention, a power transducer for monitoring a power line exhibiting given power and phase characteristics is provided. The transducer includes an arrangement for monitoring a first electrical parameter of the power line to derive a first scaled signal corresponding therewith and which exhibits a phase deviating from the given phase of the power line by a first error angle. A reference is included for providing first and second reference signals of opposed polarity. Additionally, an integrator stage means is provided including an amplifier having inverting and non-inverting inputs for providing an integrated output. A trigger, which may be present as a Schmitt trigger, is incorporated within the transducer which is responsive to the integrated output for providing time variable actuating signals corresponding with the integrated output. A second electrical parameter of the power line is monitored to derive second and third scaled signals of opposite polarity corresponding therewith and which exhibit a phase deviating from the given phase of the power line by a second error angle. A low pass filter is provided having an input for selectively receiving the second and third scaled signals and which provides a power responsive output. A switching arrangement which is actuable in response to the time variable actuating signals is incorporated within the transducer for alternately effecting the application of the first and second reference signals to the amplifier inverting input and, simultaneously, alternately effecting the application of the second and third scaled signals to the low pass filter. A phase adjustment network is provided which is responsive to the first scaled signal for providing a predetermined phase related signal at the amplifier non-inverting input to effect a selected phase relationship of the low pass filter power responsive output with respect to the given power line phase characteristic.

Other objects of the invention will, in part, be obvious and will, in part, appear hereinafter.

The invention, accordingly, comprises the apparatus possessing the construction, combination of elements, and arrangement of parts which are exemplified in the following detailed disclosure.

For a fuller understanding of the nature and objects of the invention, reference should be had to the following detailed description taken in connection with the accompanying drawings.

DETAILED DESCRIPTION

Figure 1:
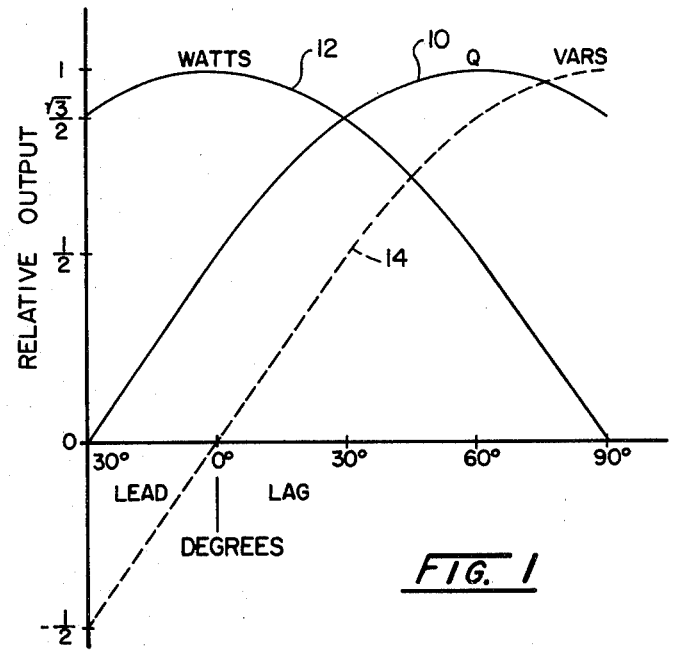
FIG. 1 shows a family of curves illustrating the useful range of a transducer showing values of Q, vars, and watts.

Referring to FIG. 1, a graphic indication of the considerable value of a transducer system having capability for substantial phase adjustment is revealed. The curves therein illustrate the useful range of a typical Q-hour transducer, the Q value output thereof being represented by curve 10 and a watt curve being represented at 12. The characteristic of the transducer represented by curve 10 shows that where Q is monitored, all Q values are positive from 30° leading (0.866 power factor leading) to 90° lagging (0 power factor lagging). Q is defined as volts $\times$ amperes $\times \cos(\theta - 60°)$, while vars are defined as volts $\times$ amperes $\times \cos(\theta - 90°)$. The Q output signal of the transducer system is converted to var reactive power by straightforward computation, as represented by the following expression:

$$\text{vars} = (2Q - \text{watts})/\sqrt{3} \text{ and}$$

$$\text{varhours} = 2(Q\text{hours} - \text{watthours})/\sqrt{3}$$

Looking at curve 14 representing a var characteristic, it may be noted that a corresponding var characteristic over the same expected range of power factor in a typical utility system has a negative aspect. Where varhour data is required, without more, two output signals would be required because of the negative relative output for leading power factor conditions. Accordingly, for installations wherein the output of the transducers is recorded on magnetic tracks, a selective 60° phase may be utilized to record Qhour values from which varhour may be derived. All such values represent positive quantities over the power factor range typically encountered. Such data generally is introduced to computers which can carry out the computations required to achieve corresponding varhour valuations with relative ease.

Figure 2:
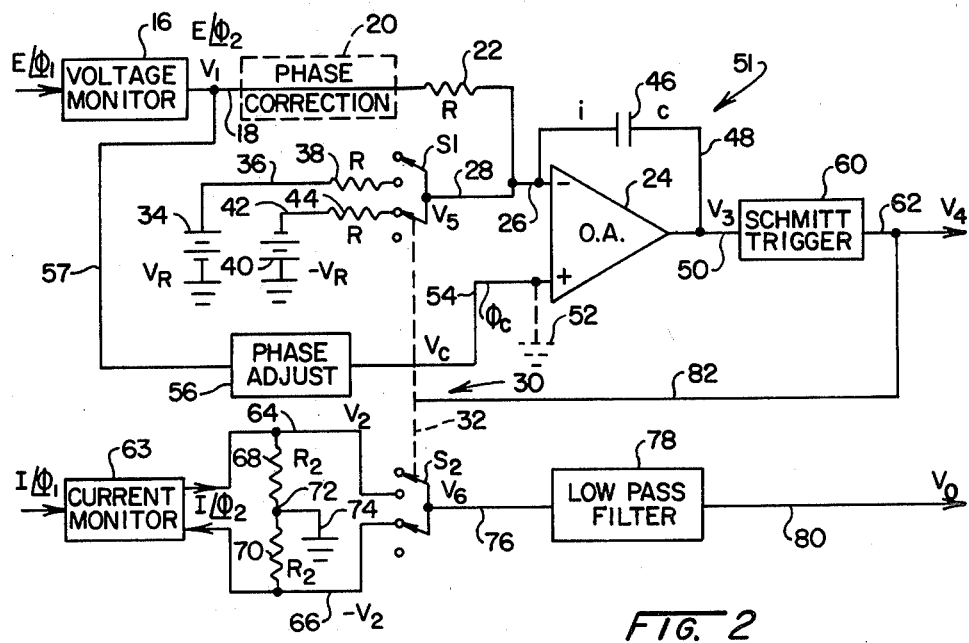
FIG. 2 is a schematic circuit diagram of the transducer according to the invention.

Looking to FIG. 2, a transducer circuit according to the invention which achieves selective phase shift as well as phase shift correction occasioned from the inputs of voltage pick-off devices is revealed. The phase shift control will be seen to be a part of the transducer system itself as opposed to being an additional input circuit which, as described above, contributes to transducer output inaccuracies. Following a description of the circuit, an analysis thereof is provided showing that in-system phase control is achieved with the invention. Further, it will be observed that the invention is concerned with achieving such phase shift control and correction in conjunction with an integrating form of time division multiplier, the operation of which is based upon the above-discussed first principle wherein a variable frequency is involved.

Figure 3:
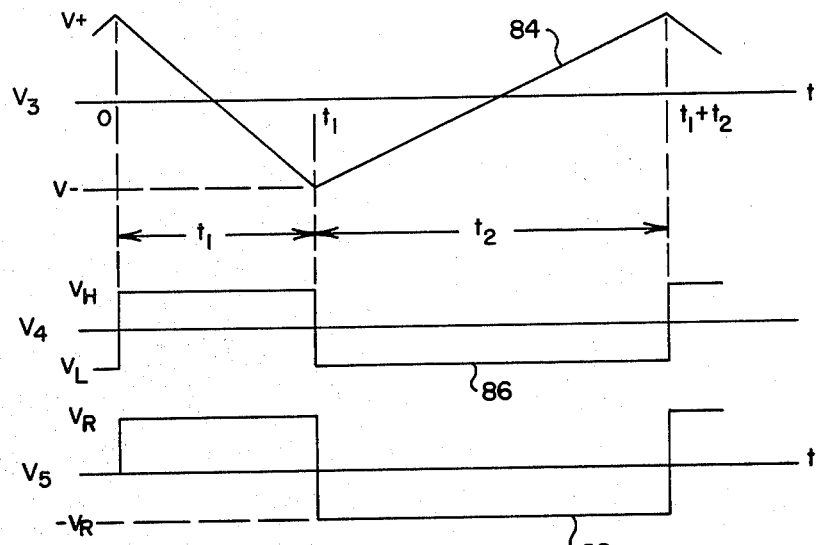
FIG. 3 shows a family of curves associated with the operation of the circuit of FIG. 2.

Referring to FIGS. 2 and 3, a transducer circuit according to the invention and associated voltage curves are revealed. In FIG. 2, voltage monitoring of the power line being examined is represented at block 16. As indicated earlier, such as monitor may, for example, be present as a shunt connected transformer or the like. This monitoring function necessarily induces a minor phase change at the output thereof at line 18 which is labeled $v_1$. In the prior art, this signal, $v_1$, would be corrected for phase at this position as represented by the dashed boundary 20. However, this approach to correction is not utilized with the instant invention. Instead, line 18 incorporates an input resistor 22 labeled R directly coupled to the inverting, negative terminal input of an operational amplifier 24 from along line 26. Also coupled to line 26 is a line 28 extending from one double throw component S1 of a voltage controlled switch represented generally at 30 which additionally includes a second double throw component S2. The association between switches S1 and S2 is represented by a dashed line 32. Switch S1 provides a reference voltage labeled $v_5$ at line 28 in consequence of its alternate connection with reference voltage source 34, labeled $V_R$, and connectable with the switch through line 36 which, in turn, incorporates resistor 38. In the orientation shown, switch S1 provides a negative reference voltage emanating from voltage source 40 which is coupled through line 42 and resistor 44 thereto.

Operational amplifier 24 is configured in conjunction with a capacitor 46 within a feedback line 48 to operate as an integrator stage represented generally at 51. The output of this integrator is at line 50 and is designated $v_3$. In normal integrator design, the non-inverting or positive terminal input of amplifier 24 would be coupled to ground as shown in phantom at 52. However, in accordance with the instant invention, an input signal is provided at this non-inverting input terminal from along line 54 which is coupled to a phase adjust network represented at block 56. The block 56 network is shown coupled to receive signal $v_1$ at line 18 via line 57. The signal labeled $v_c$ at line 54 is of a value selected not only for adjusting for the phase shift encountered at monitoring function 16 but also may provide a predetermined phase shift, for example of 30°, 60° or 90° to permit the transducer to derive an output representing a power value such as Q, watts or, if desired, var. The derivation of the signal $v_c$ is described in enhanced detail later herein.

Output line 50 from the integration stage is directed to the input of a dual threshold Schmitt trigger represented at 60 and the output thereof is represented at line 62 which is labeled $v_4$. Trigger 60 operates in accordance with the characteristic represented at FIG. 6, having threshold switching levels both at select negative and positive values ($V_-$, $V_+$) of $v_3$ at input line 50.

The current monitoring function of the transducer is represented by block 63. This monitoring generally is provided by a transformer, the outputs of which are coupled by lines 64 and 66 leading to the spaced poles of component S2 of switch 30. Lines 64 and 66 carry the labeled signals $v_2$ of opposite polarity by virtue of their connection with resistors 68 and 70 within line 72, the center tap between which is coupled to ground through line 74. These signals will exhibit a phase error with respect to line power and alternately are passed through switch S2 to line 76 which is shown carrying signal $v_6$ and which is introduced to the input of a low pass filter 78 to provide a product signal output, $v_0$ at line 80. Switch 30 is driven by the alternating output voltage $v_4$ at line 62 which is coupled thereto via line 82.

The integrated signal at line 50, operating in conjunction with trigger 60, serves to provide a duty cycle proportional to the input voltage to the transducer. Accordingly, looking to waveforms 84 and 88 in FIG. 3, during the presence of a negative reference input $v_5$ ($-V_R$) to amplifier 24, the input to trigger 60, $v_3$, is ramping down over an interval designated $t_1$. As the negative threshold ($V_-$) of trigger 60 is approached, as represented at waveform 86, switching signal $v_4$ will have a negative value until threshold is reached, whereupon switch 30 is actuated and a positive reference signal $v_5$ at line 28 will ensue over an interval shown as $t_2$ for each of the waveforms 84 and 86.

Considering the general theory of time division multiplication in accordance with the earlier discussed initial principle, it may be observed that the applied or input voltage, $v_1$, is related to the duty cycle $(t_1-t_2)/(t_1+t_2)$ for the usual case wherein resistors 22, 38 and 44 are of equal value as follows:

$$v_1/V_R = (t_1-t_2)/(t_1+t_2) \qquad (1)$$

By operating switch 30 and, particularly component S2 thereof to connect voltage proportional to current or proportional to the negative of current in the alternate fashion represented in FIG. 3 and by passing the resultant voltage, $v_6$ at line 76 through filter 78, the output, $v_0$ at line 80 may be expressed as follows:

$$v_o = 1/T \int_0^T v_3 dt = 1/T \int_0^{t_1} v_2 dt + 1/T \int_{t_1}^{t_1+t_2} (-v_2)dt, \qquad (2)$$

where T is the period or $t_1+t_2$. Carrying out the integration, the following two expressions obtain:

$$v_o = 1/T[v_2 t_1 - v_2[t_1+t_2-t_1]] = v_2(t_1-t_2)/T \qquad (3a)$$

$$v_o = v_2 v_1/V_R = R_2(iv_1)/V_R = (R_2/V_R)p \qquad (3b)$$

where p is the instantaneous power.

Further averaging over many cycles by the low pass filter 78 produces the average:

$$v_o = (P \text{ average})R_2/V_R. \qquad (4)$$

Thus the average power is derived at output line 80.

By selecting the value $v_c$ through the phase adjust component 56, the time division multiplication carried out by the transducer may not only be fully and accurately corrected for phase error evoked at monitor 16, but also may be arranged to provide necessary phase adjustment to derive an accurate output signal $v_0$ representing a power parameter such as Q, var or watts. This phase adjustment is not provided as a separate circuit operating in conjunction with the transducer, but, because it is introduced to the non-inverting input of amplifier 24 of the integration stage 51, the adjustment becomes an integral part of the integration stage, changing its configuration to thereby eliminate the inaccuracies otherwise caused by separate corrections as represented at 20. The major or power factor related phase adjustment also may be carried out through this technique and such adjustment enjoys the same advantage of high accuracy and reliability.

Figure 4:
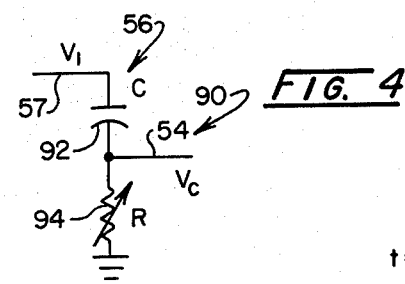
FIG. 4 is a circuit drawing of a phase adjusting arrangement according to the invention suited for operation with the circuit of FIG. 2.

Looking to FIG. 4, one implementation for the phase adjust function 56 is revealed. In that line 57, carrying the input voltage, $v_1$ is directed to an R-C network 90 including a capacitor 92 and resistor 94, the latter being coupled to ground and the network being tapped in conventional fashion intermediate those components by input line 54 leading to the non-inverting input of amplifier 24 of integrator stage 51. Resistor 94 and/or capacitor 92 may be present as variable types so as to provide operator selection of phase correction and phase adjustment within the integrator stage.

The phase correction and/or adjustment carried out by the instant invention may be summarized in terms of phase angle alterations as generated at the inputs to monitors or pick-offs 16 and 63. Looking again to FIG. 2, labeling may be observed at the input of monitor 16 wherein a voltage designated, E, is shown as exhibiting a phase angle $\phi_1$ which is considered to be extant at the power line being monitored. Similarly, monitor 63 observes a current designated, I, which has a phase angle at the input to the monitor of $\theta_1$. A phase error will be introduced by each of the monitors 16 and 63, the signal $v_1$ at the output of monitor 16 being shown as having a phase angle now designated as $\phi_2$. Similarly, the output of monitor 63 will be present as a current having a phase angle now of $\theta_2$. With these definitions, the following expressions apply:

$$\phi_2 = \phi_1 + \phi_{error} \tag{5}$$

$$\theta_2 = \theta_1 + \theta_{error} \tag{6}$$

If uncorrected, the output of the transducer at line 80 may be expressed as follows:

$$V_{ou} = \frac{R_2}{V_R} EI \cos(\phi_1 - \theta_1 + \phi_{error} - \theta_{error}) \tag{7}$$

Where a phase adjustment according to the invention is asserted at line 54, a phase correction labeled $\phi_c$ is provided such that equation (7) may be rewritten for a compensated condition as follows:

$$V_{oc} = \frac{R_2}{V_R} EI \cos(\phi_1 - \theta_1 + \phi_{error} - \theta_{error} + \phi_c) = \frac{R_2}{V_R} EI \cos(\phi_1 - \theta_1) \tag{8}$$

Where a phase angle adjustment, for example, to produce a var transducer is provided, expression (8) would be written as follows:

$$V_{oc} = \frac{R_2}{V_R} EI \cos(\phi_1 - \theta_1 + 90°) \tag{9}$$

Figure 5:
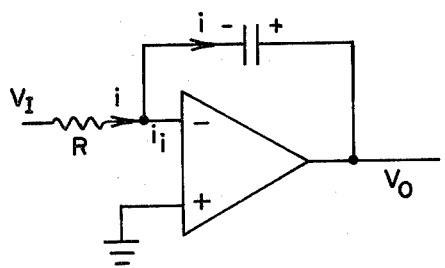
FIG. 5 is a schematic diagram of a representative operational amplifier.

Turning now to an analysis of the performance of the phase adjust signal derived at block 56 with respect to the integrating stage 51 of the transducer, reference momentarily is made to FIG. 5 wherein a conventional integration stage operating in conjunction with an operational amplifier is shown. As is known, an operation amplifier is a device which ideally has an infinite input resistance and has an infinite gain. As labeled on the drawing, assuming an input voltage $v_I$ is impressed across input resistor, R, a resultant current i is evolved. The current input to the inverting terminal of the operational amplifier of the integration stage ideally is 0, and in real conditions, may be expressed as $i_i$, a current of value very much lower than current, i. Accordingly, the current at the integrating feedback capacitor, C, also may be deemed to be i. The input to the inverting terminal of the operational amplifier may be considered as 0 volts and the current, i, at resistor R as well as at capacitor C may be expressed as follows:

$$i = v_I/R = -C dv_o/dt \tag{10}$$

From this, the output voltage, $v_o$, may be expressed as follows:

$$v_o = -1/RC \int v_I dt \tag{11}$$

Now turning to the analysis of the performance of the transducer of the invention, reference again is made to FIGS. 2, 3 and 6. Recalling the discussion associated with FIG. 5, noting that the voltages at lines 26 and 54 essentially are equal and observing the labels at FIG. 2, the following expression for current at capacitor 46 is provided:

$$i = (v_1 - v_c)/R + (v_5 - v_c)/R = -C d(v_3 - v_c)/dt \tag{12}$$

Solving expression (12):

$$d(v_3 - v_c)/dt = -(v_1 - v_c)/RC - (v_5 - v_c)/RC \tag{13}$$

Looking to waveform 88 in FIG. 3, when $v_5$ has a value $V_R$, the time, will be at some value between 0 and $t_1$ and switch 30 component S1 will be coupled to reference voltage 34 ($V_R$). Inserting this value into equation (13) provides the following:

$$d(v_3 - v_c)/dt = -\left(\frac{v_1 - v_c}{RC} + \frac{V_R - v_c}{RC}\right), \tag{14}$$

$$v_3 - v_c = -\left(\frac{v_1 - v_c}{RC} + \frac{V_R - v_c}{RC}\right) t + V_a \tag{15}$$

where $V_a$ is a constant of proportionality. In evaluating this constant, referring to waveform 86 in FIG. 3 and FIG. 6, at time $t=0+$, a point in time just after $v_5$ has assumed the value $V_R$ and $v_3$ becomes $V_+$, the constant may be written:

$$V_a = V_+ - v_c \tag{16}$$

Inserting these values into expression (15):

$$v_3 = -\left(\frac{v_1 - v_c}{RC} + \frac{V_R - v_c}{RC}\right) t + V_+ \tag{17}$$

Looking again to FIG. 6, when t is equal to $t_1$, $v_3$ will be equal to $V_-$ and the value $t_1$ may be derived as follows:

$$V_- = -\left(\frac{v_1 - v_c}{RC} + \frac{V_R - v_c}{RC}\right) t_1 + V_+ \tag{18}$$

$$t_1 = \frac{V_+ - V_-}{\frac{v_1 - v_c}{RC} + \frac{V_R - v_c}{RC}} = RC\frac{V_+ - V_-}{v_1 + V_R - 2v_c} \quad (19)$$

Figure 6:
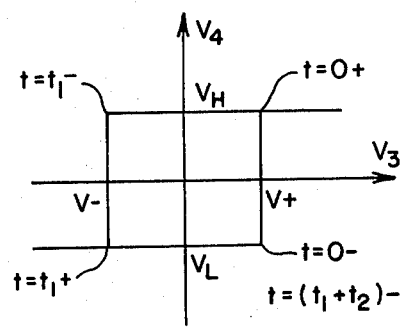
FIG. 6 is a diagram showing the characteristic of a trigger described in connection with FIG. 2.

Now considering a next time interval between $t_1$ and $t_1 + t_2$, the output of trigger 60, as represented in FIG. 6 is $V_L$ which is labeled $v_4$ in FIG. 2. Applying these values to equation (13) the following expression obtains:

$$d(v_3 - v_c)/dt = -(v_1 - v_c)/RC - (V_R - v_c)/RC \quad (20)$$

Solving the above:

$$v_3 - v_c = \left(-\frac{v_1 - v_c}{RC} + \frac{V_R + v_c}{RC}\right)(t - t_1) + V_b \quad (21)$$

where $V_b$ is a constant of proportionality. Evaluating this constant, at $t = t_1+$, $v_3$ will equal $V_-$ and $V_-$ minus $v_c$ will equal $V_b$. Inserting these values in equation (21), the following expression obtains:

$$v_3 = (V_-) - (v_1 - V_R - 2v_c)(t - t_1)/RC \quad (22)$$

Again looking at FIG. 6, at a time t is equal to $t_1 + t_2$, the signal $v_3$ will be equal to $V_+$. Inserting these values into equation (22) and solving for $t_2$, the following expression obtains:

$$t_2 = (RC)(V_+ - V_-)/(V_R - v_1 + 2v_c) \quad (23)$$

Now evaluating the earlier defined duty cycle utilizing the values of $t_1$ and $t_2$ from expressions (19) and (23), the following expression occurs:

$$(t_1 - t_2)/(t_1 + t_2) = \quad (24)$$

$$\frac{RC\dfrac{V_+ - V_-}{v_1 + V_R - 2v_c} - RC\dfrac{V_+ - V_-}{V_R - v_1 + 2v_c}}{RC\dfrac{V_+ - V_-}{v_1 + V_R - 2v_c} + RC\dfrac{V_+ - V_-}{V_R - v_1 + 2v_c}}$$

Solving expression (24):

$$(t_1 - t_2)/(t_1 + t_2) = -(v_1 - 2v_c)/V_R \quad (25)$$

Considering that waveform 86 is utilized from the purpose of switching component S2 of voltage controlled switch 30 such that $v_6$ is switched from $v_2$ to $-v_2$ and averaging the voltage $v_6$ by utilization of low pass filter 78, an integration over the time periods may be developed as follows:

$$v_o = \frac{1}{t_1 + t_2}\int_0^{t_1 + t_2} v_6 dt = \frac{1}{t_1 + t_2}\int_0^{t_1}(-v_2)dt + \quad (26)$$

$$\frac{1}{t_1 + t_2}\int_{t_1}^{t_1 + t_2}(+v_2)dt$$

Solving the above:

$$v_o = \quad (27)$$

$$\frac{1}{t_1 + t_2}[-v_2 t_1 + v_2(t_1 + t_2 - t_1)] = -v_2(t_1 - t_2)/(t_1 + t_2)$$

Substituting the value of expression (25) for the duty cycle provides the following output voltage expression:

$$v_o = -v_2\left[-\frac{v_1 - 2v_c}{V_R}\right] = v_2(v_1 - 2v_c)/V_R \quad (28)$$

Expression (28) shows that the technique of the invention does achieve phase error correction and that the approach permits the insertion of selective phase shift data as part of the integrating stage 51 itself.

As an example of utilizing expression (28) for inserting an adjusting phase shift in an amount of 90° to achieve a var output, the correcting signal, $v_c$ may be provided as follows:

$$V_c = \frac{\sqrt{2}}{2} V_1 \angle 45° \quad (29)$$

Such a signal value readily is achieved utilizing the network 90 of FIG. 4. Substituting expression (29) into expression 28, the following relationships occur:

$$V_o = V_2\left(V_1 - 2\frac{\sqrt{2}}{2}V_1 \angle 45°\right)/V_R \quad (30)$$

$$V_o = \frac{V_2 V_1}{V_R} \angle 90° \quad (31)$$

Expression 31 shows that the output of the transducer represents the product of voltages $V_1$ and $V_2$ at an angle of $-90°$ divided by the reference voltage. This is the proper equation to achieve a multiplication of the voltage $v_1$ lagging at an angle of $-90°$ which provides a measurement of var.

Generalizing the approach of expressions (29)–(31), for any correcting phase angle, $\theta$, the following relationships obtain:

$$\text{Let } v_c = \frac{k}{2}V_1 \angle \theta, \quad (32)$$

$$\text{then } v_o = V_2 V_1 (1 - k \angle \theta)/V_R \quad (33)$$

$$v_o = \frac{V_2 V_1}{V_R}[1 - k\cos\theta - jk\sin\theta] \quad (34)$$

$$v_o = \quad (35)$$

$$\frac{V_2 V_1}{V_R}\sqrt{(1 - 2k\cos\theta)^2 + k^2\sin^2\theta} \bigg/ -\tan^{-1}\frac{k\sin\theta}{1 - k\cos\theta}$$

$$v_o = \quad (36)$$

$$\frac{V_2 V_1}{V_R}\sqrt{(1 - 2k\cos\theta)^2 + k^2\sin^2\theta} \bigg/ -\tan^{-1}\frac{k\sin\theta}{1 - k\cos\theta}$$

$$v_o = \sqrt{1 + k^2 - 2k\cos\theta} \bigg/ -\tan^{-1}\frac{k\sin\theta}{1 - k\cos\theta} \quad (37)$$

Thus, if the signal $v_c$ is generated from signal $v_1$ by multiplying the latter times a value $k/2$ and shifted by a given phase angle, $\theta$, the results of equation (37) will be achieved. It further may be observed from equation (25) that the phase adjusting signal, $v_c$, serves to affect the duty cycle of a time division multiplier type transducer.

Looking specifically to the R-C network 90 of FIG. 4 and letting the selected angle be $\omega$ which, conventionally, is of a value $2\pi f$, then the following expression obtains:

$$V_c = (j\omega RC v_1)/(1 + j\omega RC) \quad (30)$$

Inserting expression (38) into equation (28), the following analysis may be made:

$$v_o = \frac{V_2 V_1}{V_R}\left(1 - \frac{2jRC}{1+j\omega RC}\right) \quad (39)$$

$$v_o = \frac{V_2 V_1}{V_R} \angle -2\tan^{-1}\omega RC \quad (40)$$

Thus, by varying the values of R and C, the designer can select any phase angle correction or adjustment, the actual angle being selected for Q valuations being 30° and 45° for var valuations.

Since certain changes may be made in the above-described apparatus without departing from the scope of the invention herein involved, it is intended that all matter contained in the description thereof or shown in the accompanying drawings shall be interpreted as illustrative and not in a limiting sense.

I claim:

1. A power transducer for monitoring a power line exhibiting given power and phase characteristics, comprising:
    means for monitoring a first electrical parameter of said power line to derive a first scaled signal corresponding therewith and exhibiting a phase deviating from said given phase by a first error angle;
    integrator stage means, including an amplifier having inverting and non-inverting inputs, for providing an integrated output;
    trigger means responsive to said integrated output for providing time variable actuating signals corresponding with said integrated output;
    means for monitoring a second electrical parameter of said power line to derive second and third scaled signals of opposite polarity corresponding therewith and exhibiting a phase deviating from said given phase by a second error angle;
    low pass filter means having an input for selectively receiving and second and third scaled signals and providing a power responsive output;
    means responsive to said time variable actuating signals for alternately effecting the application of first and second reference signals to said amplifier inverting input and, including switching means for simultaneously alternately effecting the application of said second and third scaled signals to said low pass filter means input;
    phase adjust means responsive to said first scaled signal for providing a predetermined phase related signal at said amplifier non-inverting input to effect a selected phase relationship of said filter power responsive output with respect to said given phase characteristic.

2. The power transducer of claim 1 in which said integrator stage means amplifier is an operational amplifier having a capacitive feedback intermediate its output and inverting input.

3. The power transducer of claim 1 in which:
    said first electrical parameter is voltage;
    said first scaled signal is voltage, $v_1$;
    said reference means reference signals are at a voltage level, $V_R$;
    said second electrical parameter is current and said second and third scaled signals are at a voltage level, $v_2$;
    said phase adjust means phase related signal is, $v_c$; and
    said filter output is, $v_o$, where $$v_o = \frac{v_2(v_1 - 2v_c)}{V_R}.$$

4. The power transducer of claim 3 in which said phase related signal is $$\frac{\sqrt{2}}{2} v_1$$

at an angle of 45°.

5. The power transducer of claim 1 in which said phase adjust means is an R-C network.

6. The power transducer of claim 1 in which:
    said integrator stage means amplifier is an operational amplifier having a capacitive feedback intermediate its output and inverting input;
    said first electrical parameter is voltage;
    said first scaled signal is voltage, $v_1$;
    said reference signals are at a voltage level, $V_R$;
    said second electrical parameter is current and said second and third scaled signals are at a voltage level, $v_2$;
    said phase adjust means phase related signal is, $v_c$; and
    said filter output is, $v_o$, where $$v_o = \frac{v_2(v_1 - 2v_c)}{V_R}.$$

7. The power transducer of claim 6 in which said phase adjust means is an R-C network.

8. The power transducer of claim 1 in which said phase related signal is selected having a value effecting at least the substantial correspondence of phase between said given phase characteristic and said power responsive output.

9. A power transducer comprising:
    means for receiving a signal, $v_1$, corresponding with a first monitored line electrical parameter;
    means for deriving signals at a level, $v_2$, of opposite polarity and corresponding with a second monitored line electrical parameter;
    time division multiplier means including an integration stage having inverting and non-inverting inputs, said inverting input receiving said signal, $v_1$, threshold responsive means responsive to the output of said integration stage for deriving time variable switching signals, low pass filter means having a power monitoring output, $v_o$, means for deriving reference signals, $V_R$, of opposite polarity and for effecting the alternate application of said reference signals of said opposite polarity to said inverting input and, switching means for simultaneously effecting the alternate application of said signals at level, $v_2$, of opposite polarity, to said low pass filter means; and
    phase adjust means for applying a select signal, $v_c$, at the non-inverting input of said integration stage to provide a predetermined phase angle characteristic for said low pass filter means output, $v_o$.

10. The power transducer of claim 9 in which said phase angle adjust means is responsive to said signal, $v_1$.

11. The power transducer of claim 9 in which said phase adjust means signal, $v_c$, is selected to provide a said power monitoring output, $v_o$, corresponding with the expression:

$$v_o = \frac{v_2(v_1 - 2v_c)}{V_R}.$$

12. The power transducer of claim 9 in which said first monitored line electrical parameter is voltage and said phase adjust means signal, $v_c$, is selected to evoke a 60° phase shift of said power monitoring output with respect to said monotored line voltage.

13. The power transducer of claim 9 in which said first monitored line electrical parameter is voltage and said phase adjust means signal, $v_c$, is selected to evoke a 90° phase shift of said power monitoring output with respect to said monitored line voltage.

14. The power transducer of claim 9 in which said phase adjust means is an R-C network.

15. The power transducer of claim 9 in which:
said time division multiplier means integration stage comprises an operational amplifier having said inverting and non-inverting inputs and including a capacitive feedback path coupled between said inverting input and the output of said amplifier; and
said phase adjust means comprises an R-C network responsive to said signal, $v_1$, and deriving said signal, $v_c$.

16. The power transducer of claim 15 in which the components of said R-C network are manually adjustable to selectively vary said signal, $v_c$.

17. The power transducer of claim 15 in which said phase adjust means signal, $v_c$, is selected to provide a said power monitoring output, $v_o$, corresponding with the expression:

$$v_o = \frac{v_2(v_1 - 2v_c)}{V_R}.$$

* * * * *